(12) United States Patent
Toba

(10) Patent No.: US 9,230,843 B2
(45) Date of Patent: Jan. 5, 2016

(54) LOADING UNIT AND PROCESSING SYSTEM

(75) Inventor: Katsuya Toba, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 877 days.

(21) Appl. No.: 13/450,080

(22) Filed: Apr. 18, 2012

(65) Prior Publication Data

US 2012/0269603 A1 Oct. 25, 2012

(30) Foreign Application Priority Data

Apr. 20, 2011 (JP) .................................. 2011-094365

(51) Int. Cl.
*H01L 21/677* (2006.01)
*H01L 21/67* (2006.01)

(52) U.S. Cl.
CPC .... *H01L 21/67757* (2013.01); *H01L 21/67109* (2013.01)

(58) Field of Classification Search
CPC ..................... H01L 21/67757; H01L 21/67109
See application file for complete search history.

(56) References Cited

U.S. PATENT DOCUMENTS

| | | | | |
|---|---|---|---|---|
| 5,181,819 A * | 1/1993 | Sakata et al. | ................... | 414/217 |
| 5,303,671 A * | 4/1994 | Kondo et al. | ................... | 118/719 |
| 5,447,294 A * | 9/1995 | Sakata et al. | ................... | 266/257 |
| 5,810,538 A * | 9/1998 | Ozawa et al. | ................... | 414/217 |
| 6,264,706 B1 * | 7/2001 | Hirano | ........................ | 29/25.01 |
| 6,752,874 B2 * | 6/2004 | Shim et al. | ................... | 118/719 |
| 7,547,209 B2 * | 6/2009 | Asari et al. | ................... | 432/239 |
| 7,731,797 B2 * | 6/2010 | Nakashima et al. | .......... | 118/715 |
| 7,824,496 B2 * | 11/2010 | Shimura | ........................ | 118/719 |
| 7,896,648 B2 * | 3/2011 | Nitadori et al. | .............. | 432/241 |
| 8,545,158 B2 * | 10/2013 | Kikuchi | ......................... | 414/150 |
| 2002/0197145 A1 * | 12/2002 | Yamamoto et al. | ........... | 414/806 |
| 2003/0000476 A1 * | 1/2003 | Matsunaga et al. | ........... | 118/719 |
| 2009/0269933 A1 * | 10/2009 | Yamaguchi et al. | .......... | 438/706 |
| 2012/0052203 A1 * | 3/2012 | Miyashita et al. | .......... | 427/248.1 |
| 2012/0230808 A1 * | 9/2012 | Oyama et al. | ................ | 414/806 |
| 2012/0251967 A1 * | 10/2012 | Matsuura | ...................... | 432/247 |
| 2013/0068163 A1 * | 3/2013 | Yamaguchi et al. | .......... | 118/725 |

(Continued)

FOREIGN PATENT DOCUMENTS

| | | |
|---|---|---|
| JP | 6-224143 A | 8/1994 |
| JP | 2001-93851 A | 4/2001 |
| JP | 2002-076089 A | 3/2002 |

(Continued)

*Primary Examiner* — Kaitlin Joerger
(74) *Attorney, Agent, or Firm* — Nath, Goldberg & Meyer; Jerald L. Meyer

(57) ABSTRACT

A loading unit which elevates a substrate holder holding a plurality of substrates to be subjected to heat treatment with respect to a cylindrical processing container whose bottom portion is opened and closed by a cap, includes, a loading housing, an elevator mechanism elevating the substrate holder, a shutter closing an opening of the bottom of the processing container, a substrate moving and loading mechanism having an elevatable moving and loading arm, a first partitioning box installed to surround the elevator mechanism and a moving space of the elevated substrate holder and provided with a cooling gas injecting means, a second partitioning box connected to the first partitioning box and is installed to surround the substrate moving and loading mechanism and a moving space of the substrate moving and loading mechanism, and a third partitioning box connected to the first partitioning box and is installed to surround the shutter.

9 Claims, 8 Drawing Sheets

(56) References Cited

U.S. PATENT DOCUMENTS

2013/0247937 A1* 9/2013 Nunomura et al. ............ 134/18
2014/0112739 A1* 4/2014 Hirano et al. ............ 414/217.1

FOREIGN PATENT DOCUMENTS

| JP | 2004-235425 A | 8/2004 |
| JP | 2010-086986 A | 4/2010 |

* cited by examiner

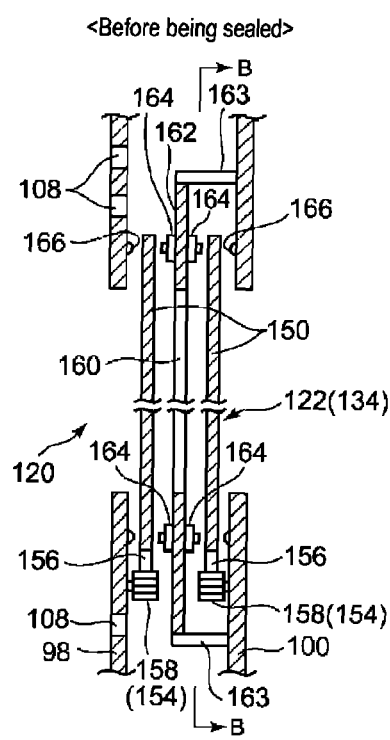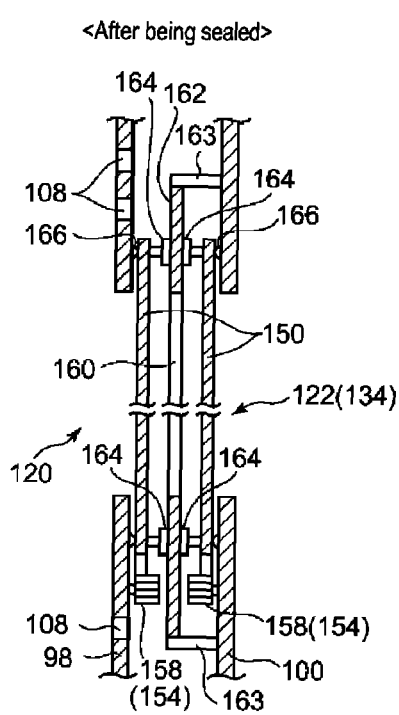

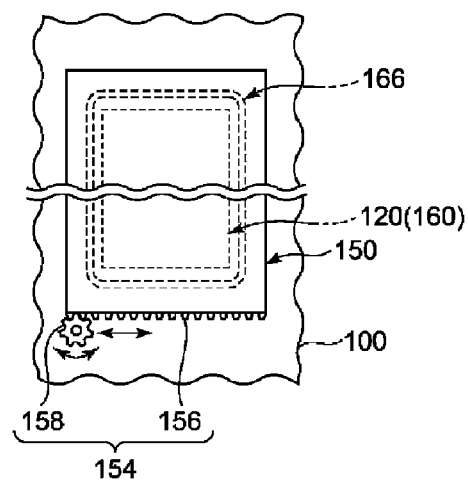

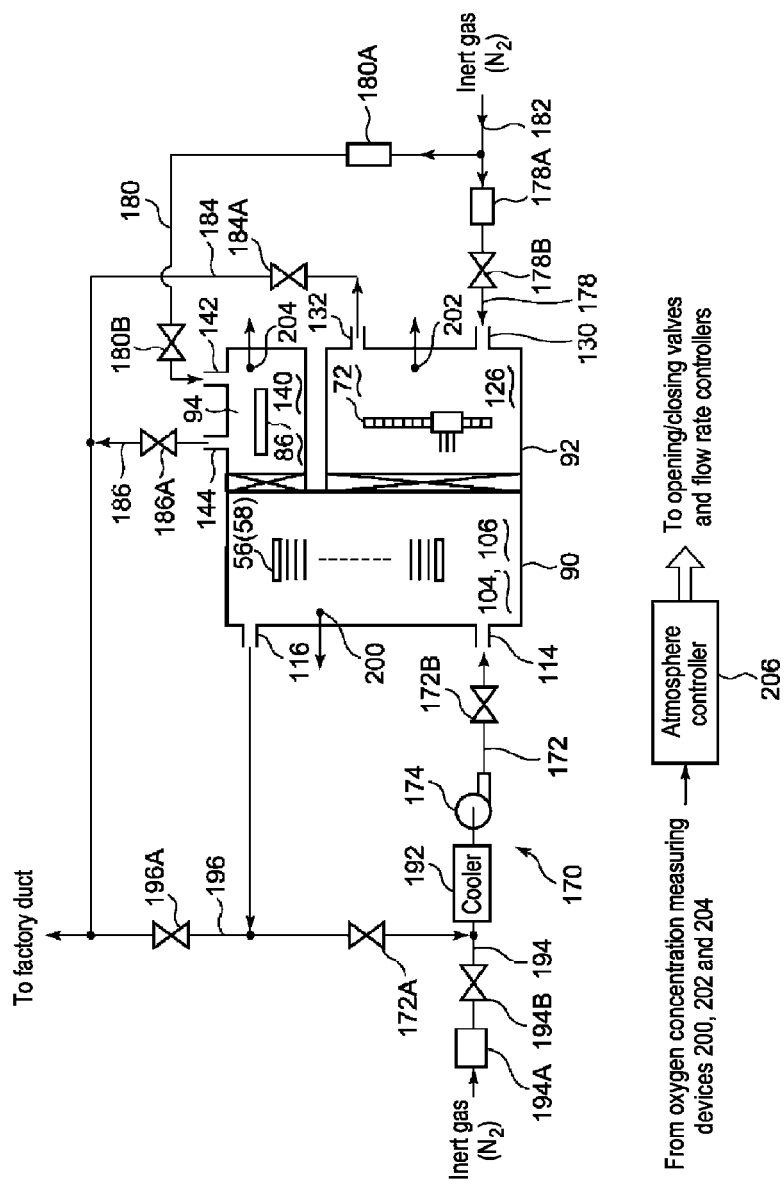

LOADING UNIT AND PROCESSING SYSTEM

CROSS-REFERENCE TO RELATED APPLICATION

This application claims the priority to Japanese Patent Application No. 2011-094365, filed on Apr. 20, 2011, in the Japan Patent Office, the disclosure of which is incorporated herein in their entirety by reference.

TECHNICAL FIELD

The present disclosure relates to a processing system which subjects a substrate such as a semiconductor wafer to heat treatment, and a loading unit used thereof.

BACKGROUND

In general, in order to manufacture semiconductor integrated circuits such as integrated circuits (ICs), large scale integrated circuits (LSIs), substrates such as semiconductor wafers are subjected to heat treatments such as film forming treatment, oxidizing and diffusing treatment, etching treatment, annealing treatment. In the related art, a vertical batch type heat treatment apparatus is used to treat a plurality of substrates at once.

In such heat treatment apparatus, a wafer boat loading a plurality of (for example 100 to 150) substrates such as semiconductor wafers is ascended and loaded (or inserted) into a vertical processing container made of quartz from a loading chamber having an inert gas atmosphere which is located below the processing container, and heat treatments such as film forming treatment are performed in the sealed processing container. After the heat treatments are performed, the wafer boat is unloaded (or descended) to replace the treated substrates with untreated wafers. Then the same heat treatments as described above are repeated.

A boat elevator installed within the loading chamber is used to elevate the wafer boat and moving and loading of the substrates are performed by a moving and loading mechanism installed within the loading chamber.

However, as described above, for the purpose of preventing natural oxidation of the semiconductor wafers such as silicon substrates and cooling the unloaded substrates having a high temperature, inert gas such as nitrogen gas is horizontally flown into the loading chamber installed below the processing container having a high temperature to bring the loading chamber into an inert gas atmosphere. The nitrogen gas is circulated and reused. In addition, the nitrogen gas is properly supplemented such that an oxygen concentration in the internal atmosphere of the loading chamber is lower than a predetermined value.

However, a large quantity of nitrogen gas is needed to put the entire internal atmosphere of the loading chamber having a considerably high capacity under the nitrogen gas atmosphere at all times. Such need of the large quantity of nitrogen gas may result in high running costs. In addition, since the nitrogen gas acting as cooling gas is flown throughout the loading chamber, a stream of gas which has no contribution to cooling the substrates may exist, which make it difficult to achieve an efficient cooling and takes a long time for cooling, which results in a low throughput.

In particular, in recent years, for the purpose of further improving the productivity of semiconductor integrated circuits, a diameter of substrates has been demanded to become larger, for example from 300 mm to 450 mm. To meet such increase in the diameter of the substrate, a pitch of substrates loaded on the wafer boat had to be increased as well to flow sufficient process gas between the substrates. For example, a pitch of substrates having a diameter of 300 mm is 6 to 7 mm, whereas a pitch of substrates having a diameter of 450 mm is required to be 8 to 12 mm.

Even in this case, since the number of substrates to be treated at once is required to be the same as in the conventional batch type heat treatment apparatus, for example, 100 to 150. Due to a high demand for improving the productivity, a height of the processing container, a length of the wafer boat and a stroke to elevate the wafer boat are increased by the amount of increase in the substrate pitch. As a result, there is a strong need to overcome the above problem that a large quantity of nitrogen gas is needed for a higher volume (or capacity) of a processing unit including the processing container and the loading chamber located below the processing unit.

SUMMARY

The present disclosure provides a loading unit and a processing system which are capable of significantly reducing the amount of inert gas used and improving a cooling efficiency by partitioning only a necessary portion of a loading chamber into a plurality of partitioning boxes into which inert gas is flown.

According to one embodiment of the present disclosure, there is provided a loading unit which elevates a substrate holder holding a plurality of substrates to be subjected to heat treatment with respect to a cylindrical processing container whose bottom portion is opened and closed by a cap, includes, a loading housing configured to surround the entire outer side of the loading unit and to form a loading chamber, an elevator mechanism configured to load and elevate the substrate holder, a shutter configured to close an opening of the bottom portion of the cylindrical processing container when the substrate holder is descended, a substrate moving and loading mechanism provided with an elevatable moving and loading arm for moving and loading the substrates on the descended substrate holder, a first partitioning box configured to surround the elevator mechanism and a moving space of the elevated substrate holder, a second partitioning box connected to the first partitioning box, and configured to surround the substrate moving and loading mechanism and a moving space of the substrate moving and loading mechanism, and a third partitioning box connected to the first partitioning box and configured to surround the shutter, wherein the first partitioning box is provided with a cooling gas injecting means for injecting cooling gas into the inner side of the first partitioning box.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A and 5B are sectional views illustrating an opening/closing gate according to some embodiments of the present disclosure.

FIG. 6 is a plan view illustrating an opening/closing gate according to some embodiments of the present disclosure.

FIG. 7 is a systematic view illustrating an inert gas (cooling gas) circulating system used in a cooling gas injecting means according to some embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Figure 1:
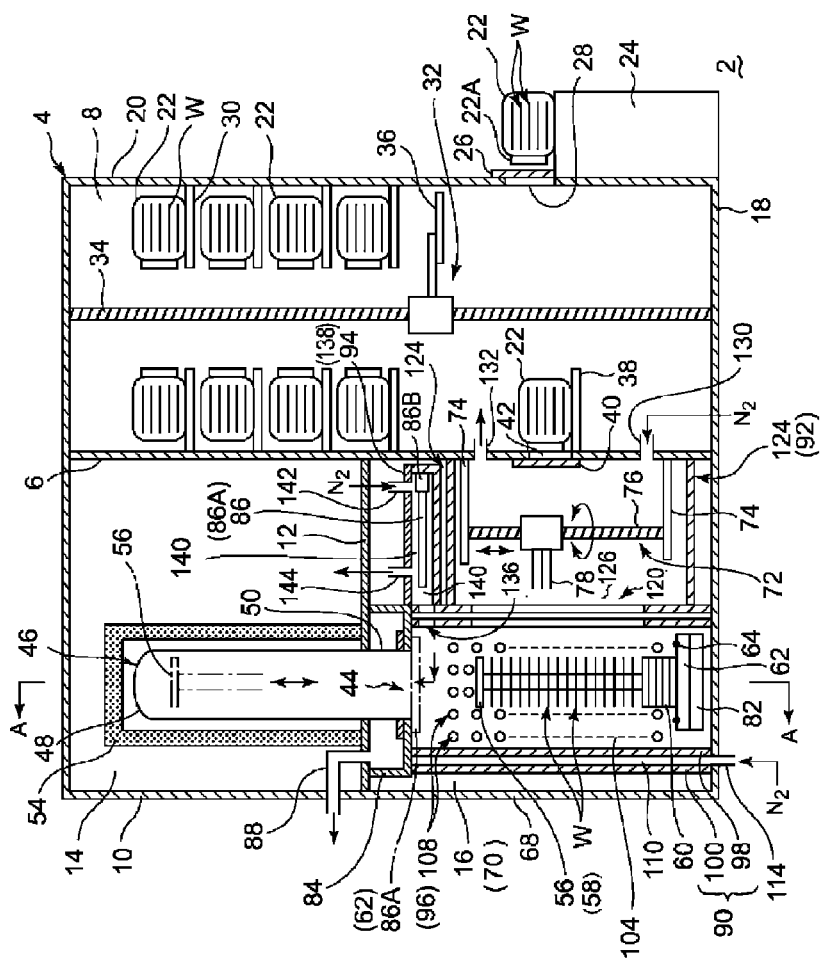
FIG. 1 is a sectional view illustrating a processing system including a loading unit according to an embodiment of the present disclosure.
Figure 2:
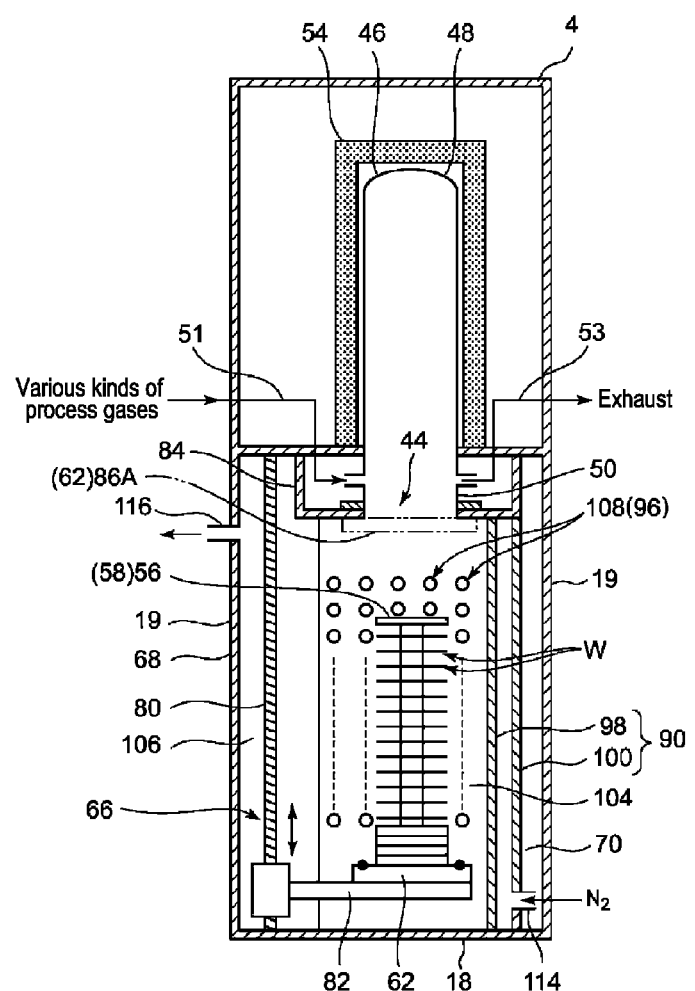
FIG. 2 is a cross-sectional view taken along line A-A in FIG. 1.
Figure 3:
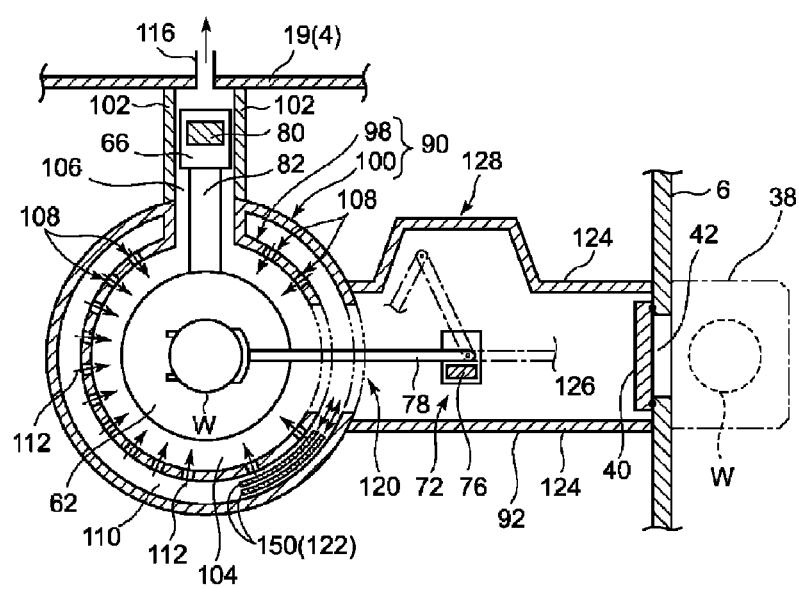
FIG. 3 is a cross-sectional view illustrating a portion of a substrate moving and loading mechanism.
Figure 4:
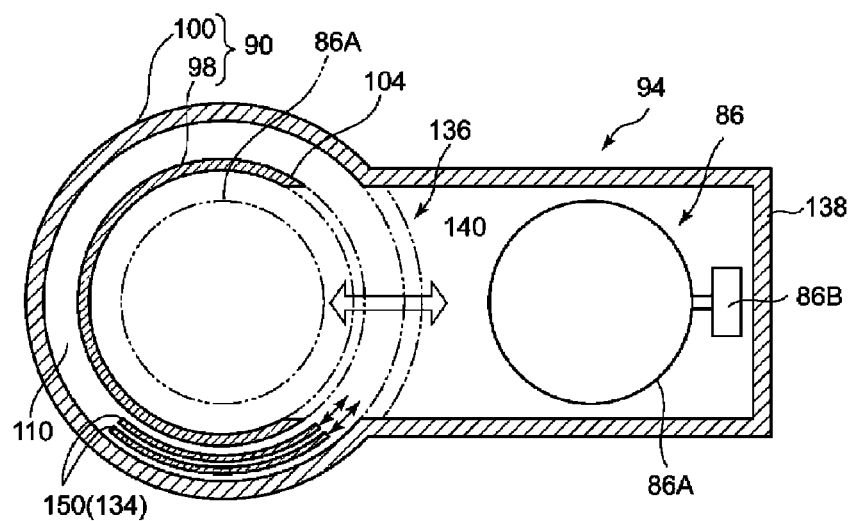
FIG. 4 is a cross-sectional view illustrating a shutter.

FIG. 1 is a sectional view illustrating a processing system including a loading unit according to an embodiment of the present disclosure; FIG. 2 is a cross-sectional view taken along line A-A in FIG. 1; FIG. 3 is a cross-sectional view illustrating a portion of a substrate moving and loading mechanism; FIG. 4 is a cross-sectional view illustrating a shutter; FIGS. 5A and 5B are sectional views illustrating an opening/closing gate according to some embodiments of the present disclosure; FIG. 6 is a plan view showing an opening/closing gate according to some embodiments of the present disclosure; and FIG. 7 is a systematic view illustrating one example of an inert gas (cooling gas) circulating system used in a cooling gas injecting means according to some embodiments of the present disclosure.

As shown in FIGS. 1 and 2, a processing system 2 is entirely installed on the bottom surface of a clean room in which a down flow of clean air is formed. The processing system 2 has an outer cover formed by a large housing 4 made of, for example, stainless steel.

A central partitioning wall 6 made of, for example, stainless steel, is installed within the housing 4. The central partitioning wall 6 horizontally partitions the interior of the housing 4 into two, a front and a rear parts (left and right sides in FIG. 1, respectively), with the front part forming a stocker unit 8. A base plate 12 as a partitioning wall made of, for example, stainless steel is horizontally installed between the central partitioning wall 6 and a rear partitioning wall 10 of the rear part of the housing 4. The base plate 12 vertically partitions the interior of the rear part into two parts, upper and lower parts. The upper part forms a processing unit 14 and the lower part forms a loading unit 16. That is, the loading unit 16 and the above-mentioned stocker unit 8 are juxtaposed.

The total weight of the processing system 2 is supported by a base plate partitioning wall 18 partitioning the bottom of the housing 4. A carrying in/out port 24 for loading a substrate container 22 storing a plurality of substrates W such as semiconductor wafers is installed in the lower part of a front partitioning wall 20 of the stocker unit 8. An openable/closable cover 22A is mounted in the front side of the substrate container 22. A carrying in/out hole 28 opened/closed by an opening/closing door 26 is installed at the front partitioning wall 20 facing the carrying in/out port 24. Further, the substrate container 22 can be carried into/out of the stocker unit 8 through the carrying in/out hole 28.

The substrate container 22 may be implemented with a cassette or an airtight container called "FOUP"® which stores, for example, 25 substrates W. In an embodiment, the substrate container 22 is implemented with the airtight container within which inert gas such as $N_2$ gas is air-tightly filled to prevent the substrates W from being oxidized.

A stock shelves 30 having multi stages is vertically installed within the stocker unit 8. On the stock shelves 30, substrates containers 22 storing untreated substrates W or treated substrates W are loaded and on standby. Further, a container moving and loading mechanism 32 is installed within the stocker unit 8. Specifically, the container moving and loading mechanism 32 has a guide rail 34 which is installed to be vertically erected, and a container transfer arm 36 which vertically moves along the guide rail 34. The guide rail 34 includes a ball screw driven by, for example, a motor. The container transfer arm 36 can be bent in a horizontal direction and rotatable in a horizontal plane such that the substrate container 22 can be transferred between the carrying in/out port 24 and the stock shelves 30.

A container moving and loading port 38 is installed within the stocker unit 8 and mounted to the central partitioning wall 6 such that the substrate container 22 can be loaded on the container moving and loading port 38. The substrate container 22 is transferred between the container moving and loading port 38 and the stock shelves 30 or the carrying in/out port 24 by means of the container moving and loading mechanism 32.

In addition, a substrate carrying in/out hole 42 opened/closed by an opening/closing door 40 is installed in the central partitioning wall 6 to which the container moving and loading port 38 is mounted. The substrates W can be carried in/out between the container moving and loading port 38 and the loading unit 16 through the substrate carrying in/out hole 42. A down flow of clean air is also formed within the stocker unit 8.

A cylindrical processing container 46 is installed within the processing unit 14. Further, the cylindrical processing container 46 has an opening 44 whose bottom is opened. The processing container 46 includes a container body 48 made of, for example, heat-resistant and corrosion-resistant quartz, and a manifold 50 made of, for example, stainless steel, which is installed in the bottom of the container body 48. The bottom of the manifold 50 corresponds to the opening 44. The lower portion of the processing container 46 is supported by the base plate 12.

A cylindrical heater 54 is concentrically installed at the outside of the processing container 46 and heats substrates accommodated in the processing container 46. A gas supply system 51 and an exhaust system 53 are connected on a side wall of the manifold 50 of the processing container 46. The gas supply system 51 supplies various kinds of gases required for heat treatments and the exhaust system 53 exhausts the interior atmosphere of the processing container 46 while controlling its pressure, as shown in FIG. 2. The processing container 46 can accommodates a substrate holder 56 for holding the substrates W in multi stages.

The substrate holder 56 includes a wafer boat 58 made of quartz, which supports the substrates W in multi stages with a predetermined pitch, and a heat insulating tube 60 made of quartz, which is installed below the wafer boat 58 and maintains temperature of the substrates W while supporting the wafer boat 58. The heat insulating tube 60 is rotatably or fixedly supported to a cap 62 which is made of, for example, stainless steel and closes the opening 44 of the processing container 46. A seal member 64 such as an O-ring for airtightly sealing the interior of the processing container 46 is interposed between the periphery of the cap 62 and the bottom of the manifold 50. As shown in FIG. 2, the substrate holder 56 is elevated by an elevator mechanism 66 installed at the loading unit 16.

An outer cover of the loading unit 16 is formed by a loading housing 68 and the inner space thereof forms an air-tightly sealed loading chamber 70. Thus, the loading chamber 70 is partitioned by the base plate 12 forming the loading housing 68, the lower portion of the rear partitioning wall 10, the lower portion of the central partitioning wall 6, the left portion of the base plate partitioning wall 18, as shown in FIG. 1, and the lower portion of a side partitioning wall 19 of the housing 4, as shown in FIG. 2.

In this manner, the loading housing 68 is continuously installed at the lower portion of the processing unit 14. In addition, the base plate 12 acts as a partitioning wall for partitioning the processing unit 14, and the central partitioning wall 6 acts as a partitioning wall for partitioning the stocker unit 8.

A substrate moving and loading mechanism 72 is installed between the portion immediately below the processing container 46 and the container moving and loading port 38 of the stocker unit 8. The substrate moving and loading mechanism 72 moves and loads the substrates W to the wafer boat 58 of the substrate holder 56. Specifically, the substrate moving and loading mechanism 72 includes a guide rail 76 which is installed to be vertically erected with its upper and lower ends supported by a fixing arm 74 extending from the central partitioning wall 6, and a moving and loading arm 78 which vertically moves along the guide rail 76. The guide rail 76 includes a ball screw driven by, for example, a motor. In the embodiment, a plurality of moving and loading arms 78 are installed and can be bent and extended in a horizontal plane such that a plurality of substrates W can be moved and loaded at once between the wafer boat 58 and the substrate container 22 installed at the container moving and loading port 38.

In addition, as shown in FIG. 2, the elevator mechanism 66 for elevating the substrate holder 56 includes a guide rail 80 which is installed to be vertically erected, and a holding arm 82 which vertically moves along the guide rail 80. The guide rail 80 includes a ball screw driven by, for example, a motor. In the embodiment, the top portion of the guide rail 80 is fixed to the base plate 12 and the bottom portion is fixed to the base plate partitioning wall 18. The holding arm 82 extends in the horizontal direction to support and hold the bottom portion of the substrate holder 56.

A scavenger box 84 is installed within the loading chamber 70 in the outside of the bottom portion of the processing container 46. The scavenger box 84 has a central lower part which is opened as the opening 44. An openable/closable shutter 86, which is closed when the substrate holder 56 is unloaded downward, is installed in the opening 44. Specifically, the shutter 86 includes a shutter body 86A which contacts and seals the opening 44, and an opening/closing driving actuator 86B which moves the shutter body 86A in the vertical and horizontal directions. The scavenger box 84 is connected with an exhaust passage 88 for exhausting the internal atmosphere of the scavenger box 84 in order to prevent exhaust heat within the processing container 46 from being introduced into the loading chamber 70.

A first partitioning box 90, an unloaded substrate holder 56, a second partitioning box 92, a third partitioning box 94 and a cooling gas injecting means 96 are set within the loading chamber 70. The first partitioning box 90 surrounds the elevator mechanism 66 and an unloaded substrate holder 56, the second partitioning box 92 is connected to the first partitioning box 90 and surrounds the substrate moving and loading mechanism 72, the third partitioning box 94 is connected to the first partitioning box 90 and surrounds the shutter 86, and the cooling gas injecting means 96 injects cooling gas into the first partitioning box 90. The first to third partitioning boxes 90, 92 and 94 are made of, for example, metal such as stainless steel.

Specifically, the first partitioning box 90 has a double tube structure including an inner tube 98 surrounding the unloaded substrate holder 56 and an outer tube 100 which is concentrically installed at the outside of the inner tube 98 with a predetermined gap therebetween. The top portions of the inner and outer tubes 98 and 100 are connected to the scavenger box 84 and the bottom portions thereof are connected to the base plate partitioning wall 18.

As such, a moving space of the elevated substrate holder 56 in the vertical direction is surrounded. A side of the elevator mechanism 66 of the inner and outer tubes 98 and 100 has a cutout portion along the vertical direction and a pair of elevator partitioning walls 102 surrounding the either side of the elevator mechanism 66 is interposed between the cutout portion and the side partitioning wall 19 (see FIG. 3) of the housing 4.

The top portions of the pair of elevator partitioning walls 102 are connected to the base plate 12 and the scavenger box 84 and the bottom portions thereof are connected to the base plate partitioning wall 18, thereby surrounding the elevator mechanism 66 and the moving space thereof. As a result, as shown in FIG. 3, a wafer boat accommodating area 104 and an elevator accommodating area 106 in the inner tube 98 communicate with each other and are entirely air tight.

A plurality of gas injecting holes 108 facing the descended substrate holder 56 are formed in the inner tube 98. The gas injecting holes 108 form a part of the cooling gas injecting means 96 and are installed along the peripheral and vertical direction of the inner tube 98. As will be described later, cooling gas supplied into a gap 110 between the inner tube 98 and the outer tube 100 is injected from the gas injecting holes 108, as indicated by arrows 112. A gas introducing hole 114, as shown in FIGS. 1 and 7, for introducing the cooling gas such as inert gas, for example, nitrogen gas and a gas discharging hole 116, as shown in FIGS. 3 and 7, for discharging the introduced gas are formed in the gap 110 between the inner and outer tubes 98 and 100.

Accordingly, the gap 110 between the inner and outer tubes 98 and 100 acts as a header of the cooling gas. As shown in FIG. 3, an opening/closing gate 122 for communicating or blocking the interior of the first partitioning box 90 and the second partitioning box 92 each other is installed at a connecting part between the first and second partitioning boxes 90 and 92. Specifically, a side of the substrate moving and loading mechanism 72 of the inner and outer tubes 98 and 100 of the first partitioning box 90 has a cutout portion along the vertical direction with a width through which the substrates W can pass and an opening 120 is formed therein.

The vertical length of this opening 120 is set to be equal to the length of the wafer boat 58 and the moving and loading arm 78 of the substrate moving and loading mechanism 72 passes through the opening 120 in order to move and load the substrates W. The opening/closing gate 122 for opening/closing the opening 120 is installed in the gap 110 between the inner and outer tubes 98 and 100. A structure of the opening/closing gate 122 will be described later.

The second partitioning box 92 includes a moving and loading mechanism partitioning wall 124 to surround the substrate moving and loading mechanism 72 and a moving space of the substrate moving and loading mechanism 72. As shown in FIG. 3, one end of the moving and loading mechanism partitioning wall 124 is connected to the outer surface of the outer tube 100 of the first partitioning box 90 and the opening 120 is positioned in the inner side thereof.

The other end of the moving and loading mechanism partitioning wall 124 is connected to both sides of the substrate carrying in/out hole 42 of the central partitioning wall 6. The ceiling and bottom portions of the second partitioning box 92 are surrounded by the moving and loading mechanism partitioning wall 124. Accordingly, the second partitioning box 92 forms an airtight moving and loading mechanism accommodating area 126. As shown in FIG. 3, the moving and loading mechanism partitioning wall 124 in a direction in which the moving and loading arm 78 can be bent is formed with an expansion section 128 projecting outward to allow bending of the moving and loading arm 78 such that a collision between the moving and loading arm 78 and the moving and loading mechanism partitioning wall 124 is prevented.

A gas introducing hole 130, as shown in FIGS. 1 and 7, for introducing the cooling gas such as inert gas and a gas discharging hole 132, as shown in FIGS. 3 and 7, for discharging the introduced gas are formed in the moving and loading mechanism accommodating area 126.

As shown in FIG. 4, an n opening/closing gate 134 for communicating or blocking the interior of the first partitioning box 90 and the third partitioning box 94 each other is installed at a connection part between the first and third partitioning boxes 90 and 94, that is, the top portion of the first partitioning box 90. Specifically, a side of the shutter 86 of the inner and outer tubes 98 and 100 of the first partitioning box 90 has a cutout portion with a width through which the shutter body 86A can pass and an opening 136 is formed therein. The shutter body 86A can pass through the opening 136 such that it is intruded into and retreated from the first partitioning box 90. The opening/closing gate 134 for opening/closing the opening 136 is installed in the gap 110 between the inner and outer tubes 98 and 100. A structure of the opening/closing gate 134 will be described later.

The third partitioning box 94 includes a shutter partitioning wall 138 to surround the shutter 86 and a moving space of the shutter 86. As shown in FIG. 4, one end of the shutter partitioning wall 138 is connected to the outer surface of the outer tube 100 of the first partitioning box 90 and the opening 136 is positioned in the inner side of the shutter partitioning wall 138.

The shutter partitioning wall 138 has a box shape as a whole and, accordingly, the third partitioning box 94 has an airtight shutter accommodating area 140. A gas introducing hole 142, as shown in FIGS. 1 and 7, for introducing the cooling gas such as inert gas and a gas discharging hole 144, as shown in FIGS. 1 and 7, for discharging the introduced gas are formed in the shutter accommodating area 140.

The two opening/closing gates 122 and 134 for opening/closing the space between the first partitioning box 90 and the second and third partitioning boxes 92 and 94 will be described below. Since the opening/closing gates 122 and 134 have the same structure although different in size, the opening/closing gate 122 for opening/closing the space between the first and second partitioning boxes 90 and 92 will be here described with reference to FIGS. 5A, 5B, and 6 and explanation of the opening/closing gate 134 will be omitted. FIG. 5A illustrates a state before an opening is sealed by the opening/closing gate and FIG. 5B illustrates a state after the opening is sealed by the opening/closing gate. FIG. 6 is a plan view taken along line B-B in FIG. 5A.

The opening/closing gate 122 has a pair of gate plates 150, which are slightly larger than the area of the opening 120 and installed in parallel. The two gate plates 150 is formed to have a curved surface shape such that they are moved in the gap 110 between the inner and outer tubes 98 and 100 of the cylindrical first partitioning box 90 along the peripheral direction of the gap.

Horizontal moving mechanisms 154 are installed below the gate plates 150. The horizontal moving mechanisms 154 moves the gate plates 150 in the horizontal direction along their curve surface direction. Specifically, each of the horizontal moving mechanisms 154 includes a rack 156 installed in the bottom of the gate plates 150, and a pinion 158 mounted in the side of the inner and outer tubes 98 and 100 and engaging with the rack 156. When both pinions 158 are rotated forward and backward in synchronization, the gate plates 150 can be horizontally moved toward the opening. The horizontal moving mechanisms 154 are not limited to the combination of the rack 156 and the pinion 158 but may employ any mechanisms as long as they can horizontally move the gate plates 150.

A fixing frame 162 is installed within the gap around the opening 120. The fixing frame 162 has an opening 160 whose size is equal to or larger than the size of the opening 120. The fixing frame 162 is located in the center of the gap 110 in the width direction and is fixed to the side of the inner tube 98 or the outer tube 100 by means of a mounting arm 163 or the like. In the embodiment, the mounting arm 163 is fixed to the side of the outer tube 100.

Pressing pins 164 are installed in both sides of the fixing frame 162. The pressing pins 164 corresponding to the periphery of the gate plates 150 are located in the opening 120. A plurality of pressing pins 164 is installed along the periphery of the gate plates 150. As shown in FIG. 5B, the pressing pins 164 are projected and retracted, one of the pair of the gate plates 150 presses and seals the inner tube 98 and the other presses and seals the outer tube 100 in synchronization. In this case, annular seal members 166 such as O-rings, are installed in opposing surfaces of the inner and outer tubes 98 and 100 along the periphery of the opening 120 in order to increase sealability for air-tightness by pressing the gate plates 150 to the seal members 166.

The loading unit 16 has a gas circulating system 170 for circulating the cooling gas such as inert gas in the first to third partitioning boxes 90, 92 and 94, as shown in FIG. 7.

The gas circulating system 170 has a circulating passage 172 for circulating the inert gas. The upstream of one end of the circulating passage 172 is connected to the gas discharging hole 116 of the first partitioning box 90 and the downstream of the other end thereof is connected to the gas introducing hole 114 of the first partitioning box 90, thereby forming a circulating system between the first partitioning box 90.

A first opening/closing valve 172A, a cooler 192, a gas blower 174 and a second opening/closing valve 172B for cooling and circulating the inert gas are sequentially installed in the course of the circulating system 172. An example of the gas blower 174 may include, but is not limited to, a sirocco fan.

A gas supply route 194 for supplying the inert gas such as $N_2$ gas is branched from the circulating passage 172 between the first opening/closing valve 172A and the cooler 192. A flow rate controller 194A such as a mass flow controller, and an opening/closing valve 194B along a gas flow direction are sequentially installed in the course of the gas supply route 194. A gas exhaust route 196 communicating to a factory duct is branched from the circulating passage 172 at the upstream of the first opening/closing valve 172A, and an opening/closing valve 196A is installed in the course of the gas exhaust route 196, thereby allowing unnecessary gas to be flown to the factory duct for atmospheric dissipation.

In addition, the inert gas can be supplied into the second and third partitioning boxes 92 and 94. That is, another gas supply route 182 for supplying the inert gas is branched to two gas introduction branch routes 178 and 180. A flow rate controller 178A such as a mass flow controller, and an opening/closing valve 178B connected to the gas introducing hole 130 of the second partitioning box 92 are sequentially installed in the course of one gas introduction branch route 178.

A flow rate controller 180A such as a mass flow controller, and an opening/closing valve 180B are sequentially installed in the course of the other gas introduction branch route 180. Further, the opening/closing valve 180B is connected to a gas introducing hole 142 of the third partitioning box 94. In addition, in order to form the two gas supply routes 182 and 194, one gas supply route may be branched from the other gas supply route.

A gas exhaust route 184 having an opening/closing valve 184A installed in the course extends from the gas discharging hole 132 of the second partitioning box 92. A gas exhaust route 186 having an opening/closing valve 186A installed in the course extends from the gas discharging hole 144 of the third partitioning box 94. The gas exhaust routes 184, 186 and 196 are joined for exhaustion to the factory duct. With the above configuration, by manipulating the above opening/closing valves, it is possible to supply the inert gas into the first to third partitioning boxes 90, 92 and 94 selectively, as necessary.

Respective oxygen concentration measuring devices 200, 202 and 204 are set within the first to third partitioning boxes 90, 92 and 94. The respective oxygen concentration measuring devices 200, 202 and 204 measure the oxygen concentration in the respective first to third partitioning boxes 90, 92 and 94. Measurements of these oxygen concentration measuring devices 200, 202 and 204 are transmitted to an atmosphere controller 206. The atmosphere controller 206 controls an opening/closing operation of each valve as necessary, such as when new $N_2$ gas is supplied if the measurements of the oxygen concentration are lower than a set value, or when inert gas is needed as cooling gas in company with heat treatment of the substrates W. This would enable the oxygen concentration of the internal atmosphere of the first to third partitioning boxes 90, 92 and 94 to be lower than the set value at all times. The entire operation of the processing system 2 as configured above is controlled by a system controller such as a computer.

The operation of the processing system as configured above will be now described. First, explaining the entire flow, the first to third partitioning boxes 90, 92 and 94 installed within the loading chamber 70 are filled with inert gas such as nitrogen gas and have an oxygen concentration lower than a predetermined value. That is, as shown in FIG. 7, the nitrogen gas is flown through the gas supply route 194 in the gas circulating system 170 with its flow rate controlled, and the nitrogen gas flowing through the circulating passage 172 is introduced into the first partitioning box 90 through the gas introducing hole 114.

The internal atmosphere of the first partitioning box 90 is again flown and circulated into the circulating passage 172 through the gas discharging hole 116. In addition, the nitrogen gas is supplied into the second and third partitioning boxes 92 and 94 through the gas supply route 182 and the gas introduction branch routes 178 and 180, respectively, with its flow rate controlled. If the measurements of the oxygen concentration measuring devices 200, 202 and 204 installed within the first to third partitioning boxes 90, 92 and 94 are higher than the set value, the opening/closing valves 184A, 186A and 196A installed in the respective gas exhaust routes 184, 186 and 196 are opened individually to discharge the nitrogen gas to the factory duct. Exhaustion of the internal atmosphere of the first to third partitioning boxes 90, 92 and 94 are independently controlled for each of the first to third partitioning boxes 90, 92 and 94. At this time, when the atmosphere flown into the first partitioning box 90 is exhausted, the first opening/closing valve 172A of the circulating passage 172 is closed.

In this manner, if the air in the first to third partitioning boxes 90, 92 and 94 is substituted with nitrogen gas to set the measurements of the oxygen concentration measuring devices 200, 202 and 204 to be lower than the set value, the nitrogen gas is circulated in the circulating passage 172 by closing the opening/closing valve 196A of the gas exhaust route 196 while opening the first opening/closing valve 172A (with the second opening/closing valve 172B opened). That is, the nitrogen gas is cooled by the cooler 192 and is blown and circulated by the gas flower 174. Then, when the opening/closing valve 194B of the gas supply route 194 is closed, the supply of the nitrogen gas is stopped.

Since the atmosphere is unavoidably leaked little by little from the first to third partitioning boxes 90, 92 and 94, the opening/closing valves 178B, 180B and 194B communicating to the gas supply routes 182 and 194 are intermittently or continuously opened to supplement insufficient nitrogen gas properly. If a measurement of one of the oxygen concentration measuring devices 200, 202 and 204, which measure the oxygen concentration at all times, is higher than the set value, new nitrogen gas is immediately supplied into the corresponding partitioning box, as described above. At the same time, the atmosphere of the corresponding partitioning box containing oxygen gas having a concentration higher than the set value is exhausted to the factory duct through the gas exhaust routes 184, 186 and 196. When a measurement of the oxygen concentration in the first partitioning box 90 is lower than the set value, the nitrogen gas is again circulated and used. This operation is always performed during heat treatment of the substrates W, as will be described below.

The heat treatment of the substrates W is performed in the state where the internal atmosphere of the first to third partitioning boxes 90, 92 and 94 is substituted with the nitrogen gas as described above. First, a plurality of substrates W treated in the previous process is placed on the carrying in/out port 24 at the front side of the processing system 2 in the state where the substrates W are accommodated in the substrate container 22 filled with inert gas such as the nitrogen gas atmosphere. The substrate container 22 installed in the carrying in/out port 24 is held by the container transfer arm 36 of the container moving and loading mechanism 32 and is introduced into the stocker unit 8 after the opening/closing door 26 of the carrying in/out port 24 is opened.

The introduced substrate container 22 is temporarily loaded and on standby on the stock shelves 30. In a treatment order, the substrate container 22 again uses the container moving and loading mechanism 32 to be loaded on the container moving and loading port 38 installed in the central partitioning wall 6. When the substrate container 22 is loaded on the container moving and loading port 38, the opening/closing door 40 in the side of the substrate carrying in/out hole 42 in the opposite side is opened.

At this time, the cover 22A of the substrate container 22 is simultaneously removed to open the interior of the substrate container 22 by a cover opening/closing mechanism installed in the substrate carrying in/out hole 42. In this case, the substrate container 22 loaded on the container moving and loading port 38 is pressed to the periphery of the substrate carrying in/out hole 42 by an actuator such that the substrate container 22 is in an airtight state. In such a pressed state, the cover 22A of the substrate container 22 is opened along with the opening/closing door 40 within the loading chamber 70.

The moving and loading arm 78 of the substrate moving and loading mechanism 72 within the loading chamber 70 is used to move and load all of the substrates W within the substrate container 22 onto the wafer boat 58 of the unloaded substrate holder 56. At this time, the opening/closing gate 122 installed in the connection part between the first and second partitioning boxes 90 and 92 is horizontally slid to open the opening 120. With repetition of this operation, all substrates W within a plurality of substrate containers 22 are moved and fully loaded on the wafer boat 58. At this time, the moving and loading arm 78 is vertically moved along the height direction of the wafer boat 58 for movement and loading.

As described above, when the substrates W are fully loaded on the wafer boat 58, the opening/closing gate 122 is slid in the closing direction to close the opening 120. At the same time, the elevator mechanism 66 is driven to ascend the holding arm 82 and insert the wafer boat 58 in the processing container 46 of the processing unit 14 such that the substrates W are loaded into the processing container 46, as indicated by an dotted line in FIG. 1. Further, since the shutter body 86A installed in the opening 44 of the bottom of the processing container 46 is accommodated in the third partitioning box 94, the opening 44 is in an opening state. Then, as the substrate holder 56 including the wafer boat 58 is completely ascended and loaded, the opening 44 of the bottom of the processing container 46 is sealed by the cap 62.

When the processing container 46 is sealed in this manner, temperature of the substrates W loaded onto the processing container 46 is increased to a process temperature by the heater 54 installed in the outside of the processing container 46 and a predetermined process gas is flown into the processing container 46 while keeping the processing container 46 at a predetermined process pressure, thereby performing predetermined heat treatments such as a film forming treatment and so on.

When the predetermined heat treatments for the substrates W are completed in this manner, an operation reverse to the above-described operation is performed to carry out the treated substrates W. First, the elevator mechanism 66 is driven to descend the holding arm 82 so that the substrate holder 56 including the wafer boat 58 is taken out of the processing container 46 downward to unload the substrates W.

At this time, the loading chamber 70 is put in a closed state with the opening 136 installed in the connection part between the first and third partitioning boxes 90 and 94 closed by the opening/closing gate 134, as shown in FIG. 4, and with the opening 120 installed in the connection part between the first and second partitioning boxes 90 and 92 closed by the opening/closing gate 122, as shown in FIG. 3. Then, at the same time of descending the wafer boat 58, the cooling gas is injected from the gas injecting holes 108 of the cooling gas injecting means 96, as indicated by arrows 112 in FIG. 3, thereby cooling the descending substrates W under high temperature.

That is, as shown in FIG. 7, the cooling gas is introduced from the gas introducing hole 114 into the gap 110 between the inner and outer tubes 98 and 100 by opening the second opening/closing valve 172B of the circulating passage 172 communicating to the loading chamber 70, and the substrates W are cooled by continuously injecting the introduced cooling gas from the gas injecting holes 108 toward the substrates W from around the substrates W, as described above.

Then, when the substrate holder 56 is completed to be unloaded, the opening/closing gate 134 installed in the connection part between the first and third partitioning boxes 90 and 94 is slid into the gap 110 to open the opening 136, and the shutter 86 accommodated in the third partitioning box 94 is driven such that the opening of the scavenger box 84, that is, the opening 44 of the processing container 46, is closed by the shutter body 86A to prevent exhaust heat from being introduced into the loading chamber 70, as shown in FIG. 4.

Then, the cooling gas, such as nitrogen gas, injected from the gas injecting holes 108 is discharged out of the gas discharging hole 116, as shown in FIG. 7, and is flown through the circulating passage 172. Since this cooling gas becomes hot by cooling of the substrates W, it is cooled in the cooler 192 and is again circulated through the circulating passage 172.

In conventional processing systems, since cooling gas such as nitrogen gas is flown throughout a high-capacity loading chamber, a large quantity of nitrogen gas is needed. In addition, since a cooling efficiency is not so high, it takes a long time for cooling. However, in the present disclosure, since the loading chamber 70 is partitioned and the cooling gas is flown into the first partitioning box 90 having a lower capacity, a small quantity of nitrogen gas is needed. In addition, since the cooling gas is injected from around the substrates W, a cooling efficiency can be increased to quickly cool the substrates W in a short time.

When the substrates W are cooled to a predetermined temperature by the above-described cooling operation, after confirming that the measurement of the oxygen concentration measuring device 202, as shown in FIG. 7, installed in the moving and loading mechanism accommodating area 126 within the second partitioning box 92 is lower than a predetermined concentration value, the opening/closing valve 178B is closed to stop the cooling gas which has been injected from the gas injecting holes 108 of the cooling gas injecting means 96. Then, the opening/closing gate 122 installed in the connection part between the first and second partitioning boxes 90 and 92 is slid into the gap 110 to open the opening 120 to communicate the wafer boat accommodating area 104 to the moving and loading mechanism accommodating area 126, as shown in FIG. 3.

Then, the substrates W cooled to the predetermined temperature are traced back to a route reverse to the above-described transfer route and are carried out. That is, the treated substrates W in the wafer boat 58 is taken out by the moving and loading arm 78 of the substrate moving and loading mechanism 72 and are accommodated in an empty substrate container 22 loaded on the container moving and loading port 38. Then, after the opening/closing door 40 of the container moving and loading port 38 and the cover 22A of the substrate container 22 are all closed, the treated substrate container 22 uses the container transfer arm 36 of the container moving and loading mechanism 32 to be carried into the carrying in/out port 24 after being temporarily stored in the stock shelves 30, or immediately. Thereafter, as described above, an untreated wafer W is moved and loaded on the wafer boat 58 and is subjected to repeated heat treatment.

In this manner, since the high-capacity loading chamber 70 is partitioned into the lower-capacity first to third partitioning boxes 90, 92 and 94 into which the inert gas is flown, the amount of inert gas used can be significantly reduced. In particular, when the cooling gas is flown to cool the treated hot substrates W, since the cooling gas flown into the gap 110 formed between the inner and outer tubes 98 and 100 of the first partitioning box 90 is injected from the plurality of gas injecting holes 108 formed in the inner tube 98 toward the substrates W, only a small quantity of cooling gas used for cooling is needed, thereby reducing the amount of gas used. In addition, since the gas injecting holes 108 are formed adjacent to the periphery of the substrates W, the substrates W can be cooled in a short time with high efficiency, which may result in improvement of a throughput of heat treatment.

As described above, according to some embodiments of the present disclosure, the inert gas is flown into the first to third partitioning boxes 90, 92 and 94 formed by partitioning a necessary portion in the loading chamber in the loading unit 16 which elevates the substrate holder 56 holding the plurality of substrates with respect to the cylindrical processing container 46 for subjecting the substrates W to the heat treatment. Thus, the amount of inert gas used can be significantly reduced and a cooling efficiency can be improved. In addition, the substrates W can be cooled in a short time with high cooling efficiency, which may result in improvement of a throughput of heat treatment for the substrates.

Figure 8:
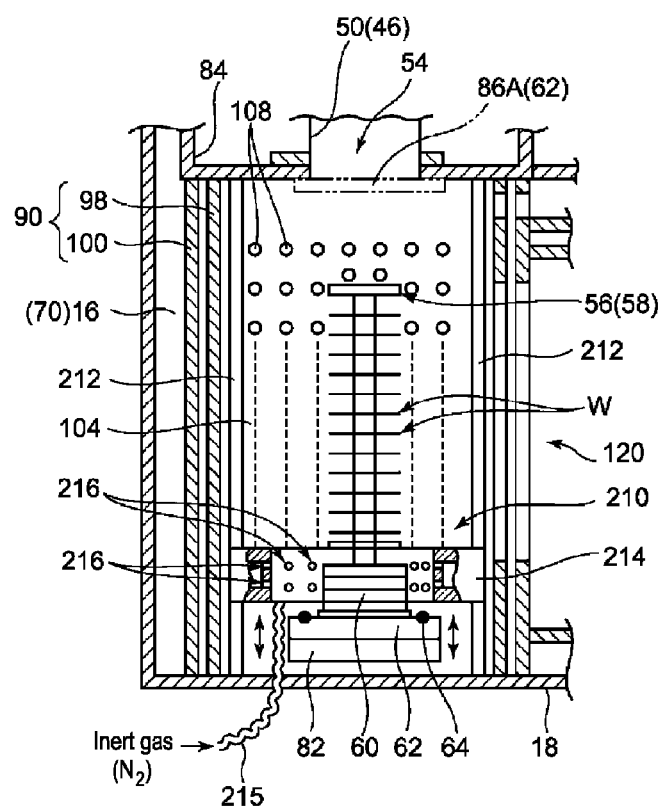
FIG. 8 is a partially-enlarged sectional view illustration a modification of the loading unit according to some embodiments of the present disclosure.

Next, the loading unit according to some embodiments of the present disclosure will be described. In the above-described embodiment, the cooling gas is uniformly injected from the plurality of gas injecting holes 108 formed in the inner tube 98 to the substrate holder 56 descending into the wafer boat accommodating area 104 within the first partitioning box 90. In another embodiment, in addition to the gas injection from the plurality of gas injecting holes 108, a large quantity of cooling gas may be injected to a high-heat capacity portion of the substrate holder 56, i.e., the heat insulating tube 60, thereby further improving the entire cooling efficiency of the substrate holder 56. FIG. 8 is a partially-enlarged sectional view illustrating the first modification of the loading unit of the present disclosure. In FIG. 8, the same elements as FIGS. 1 and 2 are denoted by the same reference numerals and explanation of which will not be repeated.

As shown in FIG. 8, an auxiliary cooling means 210 descended in correspondence to the heat insulating tube 60 when the substrate holder 56 is descended is provided. Specifically, the auxiliary cooling means 210 includes a plurality of (for example two) guide rails 212 vertically erected within the wafer boat accommodating area 104 of the first partitioning box 90, and a hollow ring-shaped cooling gas header 214 vertically moved along the guide rails 212. The guide rails 212 include ball screws driven by, for example, a motor.

The vertical width of the cooling gas header 214 is set to be substantially equal to the height of the heat insulating tube 60, and a stretchable and flexible gas route 215, such as a bellows pipe, branched from the circulating passage 172, as shown in FIG. 7, is connected to the cooling gas header 214. A plurality of gas injecting holes 216 is formed in the inner circumference of the cooling gas header in the circumferential direction and the cooling gas is injected toward the heat insulating tube 60 located in the inner side thereof through the gas injecting holes 216.

When heat treatment for the substrates W is completed and the substrate holder 56 is unloaded by being descended from the processing container 46, the cooling gas is injected from the plurality of gas injecting holes 108 formed in the inner tube 98, while the ring-shaped cooling gas header 214 of the auxiliary cooling means 210 is descended in interlock with the heat insulating tube 60 of the substrate holder 56. While being descended, the high-heat capacity heat insulating tube 60 is cooled by injecting the cooling gas from the gas injecting holes 216 formed in the cooling gas header 214 toward the heat insulating tube 60. This allows the heat insulating tube 60 to be cooled with higher efficiency and in a shorter time than the above-described embodiment, which further improves a throughput of heat treatment.

The present disclosure is not limited the above described embodiments. For example, valve openness-adjustable opening/closing valves, that is, flow rate-adjustable opening/closing valves, such as the opening valve 196A of the gas exhaust route 196, the first opening/closing valve 172A for circulation, and the opening/closing valve 194B of the gas supply route 194, may be used to exhaust some of the inert gas from the gas exhaust route 196, circulate the remaining inert gas, and supplement insufficient inert gas from the gas supply route 194. In addition, although it has been illustrated in the above embodiment that the $N_2$ gas is used as the inert gas, the present disclosure is not limited thereto. For example, rare gas such as He, Ar or the like may be used as the inert gas. In addition, the first to third partitioning boxes 90, 92 and 94 may be installed with respective supply system for supplying clean air.

In addition, the gas circulating system 170 shown in FIG. 7 is merely one example but is not limited thereto. In addition, although it has been illustrated in the above embodiment that the container moving and loading port 38 has a table shape on which the substrate container 22 is loaded, the present disclosure is not limited thereto. For example, am openable/closable sealed container storeroom may be installed as the container moving and loading port 38. In this case, the container storeroom may be installed with an inert gas introducing hole, an inert gas exhaust hole and an oxygen concentration measuring device, like the second partitioning box 92, and may be put in a controlled atmosphere by introducing the inert gas, like the interior of the second partitioning box 92. In addition, the first to third partitioning boxes 90, 92 and 94 may be installed with respective supply system for supplying clean air.

In addition, although it has been illustrated in the above embodiment that semiconductor wafers are employed as the substrates W, the semiconductor wafers may include silicon substrates and compound semiconductor substrates such as GaAs, SiC, GaN and the like, and further, the spirit of the present disclosure may be also applied to glass substrates, ceramics substrates and so on for use in liquid crystal displays.

According to one embodiment of the present disclosure, there is provided a loading unit which elevates a substrate holder holding a plurality of substrates to be subjected to heat treatment with respect to a cylindrical processing container, and a processing system using the loading unit. In the loading unit, it is possible to significantly reduce the amount of inert gas used and improve a cooling efficiency by partitioning only a necessary portion of a loading chamber into a plurality of partitioning boxes into which inert gas is flown. In addition, it is possible to cool substrates in a short time with high cooling efficiency, which may result in improvement of a throughput of heat treatment for the substrates.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures. Further, various embodiments are not necessarily mutually exclusive as aspects of one embodiment can be combined with aspects of another embodiment.

What is claimed is:

1. A loading unit which elevates a substrate holder holding a plurality of substrates to be subjected to heat treatment with respect to a cylindrical processing container whose bottom portion is opened and closed by a cap, comprising:
    a loading housing configured to surround an entire outer side of the loading unit and to form a loading chamber;
    an elevator mechanism configured to load and elevate the substrate holder;
    a shutter configured to close an opening of the bottom portion of the cylindrical processing container when the substrate holder is descended;
    a substrate moving and loading mechanism provided with an elevatable moving and loading arm for moving and loading the substrates on the descended substrate holder;
    a first partitioning box including a double tube structure having an inner tube and an outer tube concentrically installed at an outside of the inner tube with a predetermined gap between the inner tube and the outer tube, the first partitioning box being configured to surround the elevator mechanism and a moving space of the elevated substrate holder;
    a second partitioning box installed within the loading housing and connected to the first partitioning box, and configured to surround the substrate moving and loading mechanism and a moving space of the substrate moving and loading mechanism;
    a third partitioning box connected to the first partitioning box and configured to surround the shutter; and
    a cooling gas injecting means including a plurality of gas injecting holes installed along a peripheral and vertical direction of the inner tube, the cooling gas injecting means being configured to inject cooling gas into an inner side of the first partitioning box through the gas injecting holes, the cooling gas being supplied into the gap between the inner tube and the outer tube.

2. The loading unit of claim 1, wherein the plurality of gas injecting holes are formed to face the descended substrate holder.

3. The loading unit of claim 1, further comprising:
    a connection part formed between the first and second partitioning boxes; and
    an opening/closing gate installed in the connection part, and configured to communicate or to block an interior of the first partitioning box and the second partitioning box.

4. The loading unit of claim 1, further comprising:
    a connection part formed between the first and third partitioning boxes; and
    an opening/closing gate installed in the connection part, and configured to communicate or to block an interior of the first partitioning box and the third partitioning box.

5. The loading unit of claim 1, further comprising a gas introducing hole for introducing inert gas into each of the partitioning boxes and a gas discharging hole for discharging an atmosphere of each of the partitioning boxes.

6. The loading unit of claim 1, wherein the substrate holder is provided with a wafer boat for supporting the substrates and a heat insulating tube for supporting the bottom portion of the wafer boat, and
    further comprising an auxiliary cooling means which is descended in correspondence to the heat insulating tube when the substrate holder is descended.

7. A processing system comprising:
    a processing unit which subjects substrates to heat treatment;
    a loading unit of claim 1, which is installed below the processing unit; and
    a stoker unit which is installed in parallel to the loading unit and puts a substrate container accommodating a plurality of substrates on standby.

8. The loading unit of claim 1, wherein the cooling gas injecting means includes a gas introducing hole configured to introduce the cooling gas into the gap between the inner tube and the outer tube, and the loading housing includes a gas discharging hole for discharging the injected cooling gas.

9. The loading unit of claim 1, wherein the first partitioning box includes a cutout portion formed on the elevator mechanism side of the first portioning box, and a pair of elevator partitioning walls are provided between the cutout portion and the loading housing so as to surround either side of the elevator mechanism.

* * * * *